United States Patent [19]

Gonzalez

[11] Patent Number: 5,376,566
[45] Date of Patent: Dec. 27, 1994

[54] N-CHANNEL FIELD EFFECT TRANSISTOR HAVING AN OBLIQUE ARSENIC IMPLANT FOR LOWERED SERIES RESISTANCE

[75] Inventor: Fernando Gonzalez, Boise, Iowa

[73] Assignee: Micron Semiconductor, Inc., Boise, Iowa

[21] Appl. No.: 152,116

[22] Filed: Nov. 12, 1993

[51] Int. Cl.$^5$ ............... H01L 21/265; H01L 21/70; H01L 27/00
[52] U.S. Cl. ..................... 437/35; 437/52; 437/60; 437/919
[58] Field of Search ............ 437/35, 44, 27, 52, 437/60, 919

[56] References Cited

U.S. PATENT DOCUMENTS

| | | | |
|---|---|---|---|
| 5,198,386 | 3/1993 | Gonzalez | 437/52 |
| 5,250,449 | 10/1993 | Kuroyanagi et al. | 437/27 |
| 5,292,674 | 3/1994 | Okabe et al. | 437/44 |
| 5,312,768 | 5/1994 | Gonzalez | 437/40 |

FOREIGN PATENT DOCUMENTS

| | | | |
|---|---|---|---|
| 2113474 | 5/1987 | Japan | 437/35 |
| 3262130 | 11/1991 | Japan | 437/35 |
| 0536719 | 2/1993 | Japan | 437/35 |

OTHER PUBLICATIONS

Hori et al., "Deep-Submicrometer Large-Angle-Tilt Implanted Drain (LATID) Technology" IEEE Transactions on Electron Devices, vol. 39, No. 10, Oct. 1992.
A New Submicron MOSFET with LATID (Large-Tilt Angle Implanted Drain) Structure Takashi Hori, Kazumi Kurimoto, Toshiki Yabu, and Genshu Fuse pp. 15 & 16.
Mechanism Analysis of a Highly Reliable Graded Junction Gate/N Overlapped Structure in MOS LDD Transistor Y. Okumura, T. Kunikiyo, I. Ogoh, H. Genjo, M. Inuishi, M. Nagatomo and T. Matsukawa, pp. 477-480, 1989.
Angled Implant Fully Overlapped LDD (AI-Fold) NFET's for Performance and Reliability. A. Bryant, T. Furukawa, J. Mandelman, S. Mittl, W. Noble, E. Nowak, W. Wade, S. Ogura & M. Wordeman. pp. 152-157. 1989.
Drain-Structure Design for Reduced Band-to Band and Band-to-Defect Tunneling Leakage. Takashi Hori. pp. 69-70, 1990.

(List continued on next page.)

*Primary Examiner*—Brian E. Hearn
*Assistant Examiner*—Lynn A. Gurley
*Attorney, Agent, or Firm*—Angus C. Fox, III

[57] ABSTRACT

An improved N-channel field-effect transistor is fabricated by performing a vertical N− implant, aligned to the vertical edges of the gate electrode, in both the source and drain regions of the device. In a first embodiment of the invention intended for use in dynamic random access memory access devices, a dielectric spacer is then formed on the sidewall of the gate electrode adjacent the drain (i.e., the regions which functions as the bitline contact in a DRAM memory cell). A vertical N+ implant, aligned to the exposed vertical edge of that spacer, is performed, in addition to an oblique implant of an N-type impurity. The oblique implant dosage is significantly greater than the N− implant dosage, but significantly less than the N+ implant dosage. In a second embodiment of the invention intended for use in applications where the transistor has no capacitive storage node, spacers are formed on both sidewalls of the gate electrode and the N+ implant, as well as the oblique N-type implant are performed in both the source and drain regions of the device. In preferred embodiments of the invention, phosphorus is utilized as the N− implant impurity, while arsenic is utilized for the other two N-type implants. The oblique implant provides not only reduced electric field strength in the channel region, but also reduced series resistance.

10 Claims, 6 Drawing Sheets

OTHER PUBLICATIONS

SCC (Scurrounded Capacitor Cell) Structure for DRAM. G. Fuse, K. Tateiwa, S. Odanaka, T. Yamada, I. Nakao, H. Shimoda, O. Shippou, M. Fukumoto, J. Yasui, Y. Naito, and T. Ohzone. pp. 11–14, 1987.

1/4-pm LATID (Large-Tilt-angle Implanted Drain) TECHNOLOGY FOR 3.3-V Operation, Takashi Hori. pp. 32.4.1–32.4.4. 1989.

Deep-Submicrometer Large-Angle-Tilt Implanted Drain (LATID) Technology Takashi Hori, Junji Hirase, Yoshinori Odake & Takatoshi Yasui, pp. 2313–2324, 1992.

Optimum Design of Gate/N Overlapped LDD Transistor. M. Inuishi, K. Mitsui, S. Komori, M. Shimizu, H. Oda, J. Mitsuhashi & K. Tsukamoto. pp. 4-4–4-5.

A New MOSFET with Large-Tilt-Angle Implanted DRAIN (LATID) Structure. Takashi Hori, Kazumi Kurimoto 1988.

N-CHANNEL FIELD EFFECT TRANSISTOR HAVING AN OBLIQUE ARSENIC IMPLANT FOR LOWERED SERIES RESISTANCE

FIELD OF THE INVENTION

This invention relates to integrated circuits and, more particularly, to N-channel field effect transistors of lightly-doped drain (LDD) design. The invention improves the performance of such transistors by utilizing an angled arsenic implant for lowered series resistance with no increase in hot electron effect.

BACKGROUND OF THE INVENTION

As field effect transistors have been scaled down to submicron levels, the hot-carrier effect has become a major concern. In N-channel devices, the hot-carrier effect occurs when drain region bias increases to the point where the transistor is operating beyond the saturation level. In this mode of operation, as electron carriers are accelerated from the source region through the channel region to the drain region, some attain sufficient kinetic energy to break silicon-to-silicon bonds within the channel region. As the silicon-to-silicon bonds break, hole/electron pairs are generated. The holes are attracted to the negatively-biased substrate, leading to a dramatic increase in substrate current. The free electrons, on the other hand, are attracted to the positively biased gate of the device. Although most of these free electrons manage to traverse the gate dielectric layer, some become trapped within the gate dielectric layer. Although the channel-to substrate and channel-to-gate current increases power dissipation in circuit, the trapping of electrons in the gate dielectric layer is far more serious, as the threshold voltage of the device is shifted upward and current drivability of the device is decreased. At some point, threshold voltage and drivability characteristics are degraded to levels which render the device unusable.

One of the most difficult tasks faced by a designer of a submicron field effect transistor is to improve hot-carrier lifetime of the device without degrading current drivability. As it is well known that the hot-carrier effect is exacerbated by a high lateral electric field strength in the channel region, a number of approaches have been taken over the past decade to reduce the maximum lateral electric field strength short channels. The double-diffused drain (DDD) structure, with its N− and N+ implants aligned to the same gate edge, allows little freedom in optimizing the length of the N− region. By introducing a sidewall spacer to offset the N+ implant from the gate edge, a lightly-doped drain (LDD) structure is formed which offers more freedom in setting N-region lengths. However, conventional LDD devices have certain disadvantages, such as "spacer-induced degradation", a second hump in the substrate current that is related to the N+ gate offset, and increased series resistance.

Certain modifications of the conventional LDD structure have been made in the interest of eliminating some of the aforementioned drawbacks. The fully-overlapped lightly-doped drain (FOLD) structure provides a reduction in peak electric fields in the channel region by having the gate electrode completely overlap the lightly-doped drain region. Researchers from several companies have experimented with angled implants of the N− impurity (phosphorus is typically the impurity of choice) in order to achieve FOLD-type structures. Although electric field strength is reduced by such a structure, the problem of elevated series resistance remains, thus limiting the speed of the device. What is needed is a new structure which not only reduces electric field strength in the channel region, but also reduces series resistance.

SUMMARY OF THE INVENTION

This invention represents a unique modification of the lightly-doped drain design in N-channel field-effect transistors, that provides not only reduced electric field strength in the channel region, but also reduced series resistance. The focus of this invention is an oblique arsenic implant performed after formation of dielectric spacers on the gate sidewalls. The improved LDD transistor is fabricated by performing a vertical N− implant, aligned to the vertical edges of the gate electrode, in both the source and drain regions of the device. In a first embodiment of the invention intended for use in applications where the transistor has no capacitive storage node, spacers are formed on both sidewalls of the gate electrode and the N+ implant, as well as the oblique N-type implant are performed in both the source and drain regions of the device. In a second embodiment of the invention intended for use in dynamic random access memory access devices, spacers are formed on the sidewalls of the gate electrode, but the vertical N+ and oblique arsenic implant are performed only in the drain region of the transistor (i.e., the region which functions as the bitline contact in a DRAM memory cell). The oblique implant dosage is significantly greater than the N− implant dosage, but significantly less than the N+ implant dosage. In preferred embodiments of the invention, phosphorus is utilized as the N− implant impurity, while arsenic is utilized for the other two N-type implants.

The oblique implant not only creates a graded junction, which is effective in lowering the electric field strength in the channel region, but the edge of the spacer causes a tapering of the angled implant, which prevents the angle-implanted arsenic dopant from significantly increasing the N− region impurity concentration, which would tend to increase substrate current levels. For optimum transistor performance, the N− region must be at least partially overlapped by the gate electrode. The resulting tapered shape of the oblique implant region results in an arsenic gradient which decreases in concentration the closer it is to the edge of the gate electrode. Maximum concentrations of obliquely implanted arsenic will occur along the line adjacent the spacer edge which represents the oblique implant angle. Arsenic implant straggle tends to place some of the obliquely-implanted arsenic directly under the spacer. In addition, during activation and reflow steps, some of the implanted arsenic in the maximum concentration region will diffuse toward both the channel region and toward the gate dielectric layer.

PREFERRED EMBODIMENT OF THE INVENTION

FIGS. 1-5 depict the fabrication process for a first embodiment of the improved transistor, intended for use in applications where the transistor has no capacitive storage node.

Figure 1:
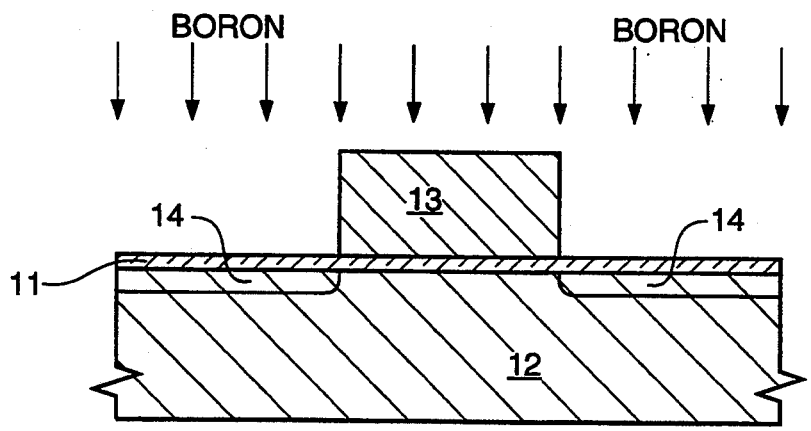
FIG. 1 is a cross-sectional view of a first embodiment of the improved field-effect transistor undergoing fabrication, at the stage where a gate dielectric layer has been formed on the substrate, a conductive layer has been patterned to form a gate electrode, and a vertical boron punch-through implant has been performed.

Referring now to FIG. 1, at this stage of the fabrication process, a gate dielectric layer 11 has been formed on a lightly-doped P-type substrate 12, a conductive layer (preferably conductively-doped polycrystalline silicon) has been patterned to form a gate electrode 13, and anti-punchthrough regions 14 have been formed with a vertical P-type implant (boron is deemed to be the preferred P-type impurity for this application) that is aligned to the vertical sidewalls of the gate electrode 13. Because it is assumed that the sidewalls of the gate electrode are substantially perpendicular to the underlying substrate 12, one could also say that the boron implant is aligned to the upper edges of the gate electrode.

Figure 2:
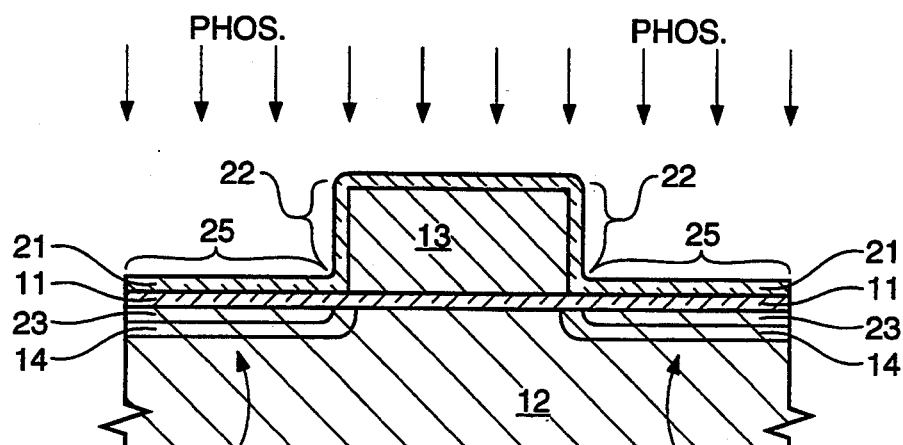
FIG. 2 is a cross-sectional view of the transistor of FIG. 1 following the deposition of a first oxide layer and a vertical N− phosphorus implant.

Referring now to FIG. 2, a first dielectric layer 21 (preferably silicon dioxide) has been conformally deposited over the in-process transistor of FIG. 1. With the first dielectric layer 21 in place, the in-process device is subjected to a vertical N− implant that is aligned to the exposed surfaces of the vertical portions 22 of the first dielectric layer 21 that are deposited on the sidewalls of the gate electrode 13. Phosphorus is the preferred N− impurity, and it is implanted at a dosage within a range of 1-2E13 (1 to $2 \times 10^{13}$ atoms/cm$^2$), and at an energy level within a range of 100-130 Kev. The phosphorus, that forms the N− regions 23 of the source/drain regions 24 in the substrate 12, is implanted through the horizontal portions 25 of the first dielectric layer 21 that directly overly the source/drain regions 25 of substrate 12.

Figure 3:
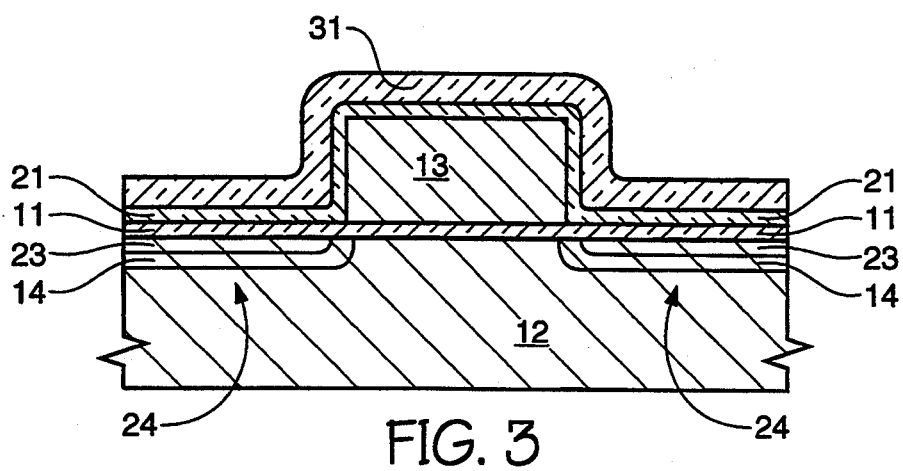
FIG. 3 is a cross-sectional view of the transistor of FIG. 2 following the deposition of a second oxide layer.

Referring now to FIG. 3, a second dielectric layer 31 (preferably silicon dioxide) has been conformally deposited over the in-process transistor of FIG. 2.

Figure 4:
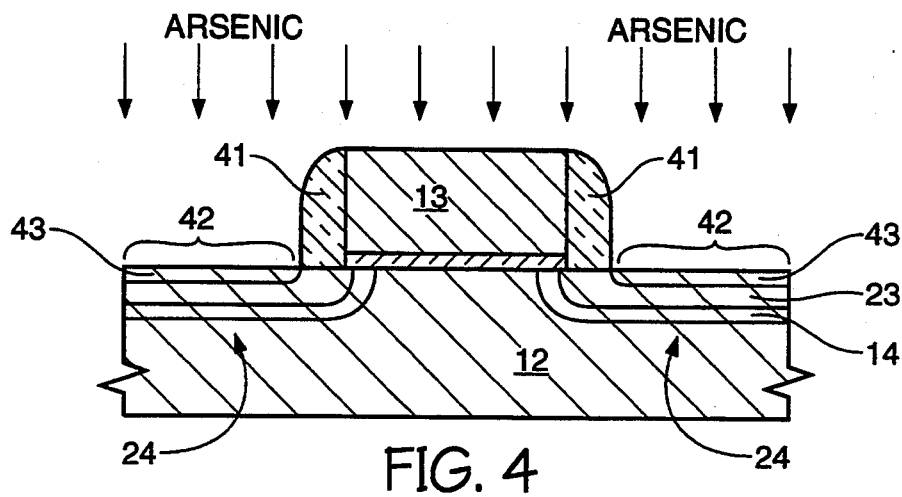
FIG. 4 is a cross-sectional view of the transistor of FIG. 3 following an anisotropic spacer etch and a vertical, N+ arsenic implant.

Referring now to FIG. 4, the in-process transistor of FIG. 3 has been subjected to an anisotropic spacer etch, which has created spacers 41 on the sidewalls of gate electrode 13 and cleared the substrate in the source/drain regions 42. A vertical N+ implant is then performed, thus creating N+ regions 42 of the source/drain regions 24, which are aligned to the exposed vertical surface of spacers 41. Arsenic is the preferred N+ impurity, and it is implanted at a dosage within a range of 4E15–1.2E16, and at an energy level within a range of 30–60 Kev.

Figure 5:
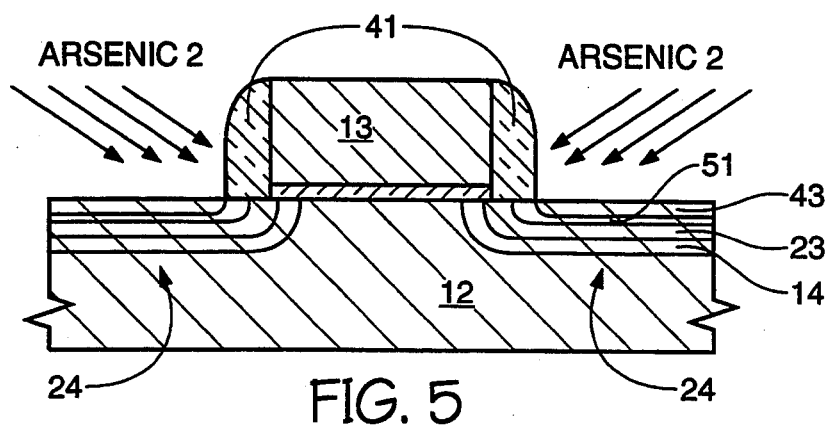
FIG. 5 is a cross-sectional view of the transistor of FIG. 4 following an oblique arsenic implant.

Referring now to FIG. 5, the in-process transistor of FIG. 4 has been subjected to an oblique N-type implant, thus creating obliquely-implanted regions 51 in the source/drain regions of the transistor. Arsenic is the preferred impurity for use with the oblique implant, and it is implanted at a dosage within a range of 3E13 to 1E15, at an energy level within a range of 80–120 Kev, and at an preferred angle of 40 degrees from the horizontal surface of the substrate 12 (50 degrees from the vertical). Although a range of implanting angles between 30 and 50 degrees are generally useable with acceptable results, impurities implanted at angles much less than 40 degrees will encounter topography, such as elevated field oxide regions, that will effectively block the implant. In addition, too low an implant angle may result in the obliquely implanted arsenic being implanted in the N− region, which will decrease the graded nature of the junction. At angles much above 40 degrees, the effective offset decreases to the point where the oblique implant step becomes increasingly less effective.

The oblique implant shown in FIG. 5 and the N+ implant shown in FIG. 4 may be reversed from a process standpoint with no appreciable effect. Since the dosage of the N+ implant is at least four times that of the oblique implant, the oblique implant does not appreciably affect the dosage in the N+ source/drain regions 42. Since the dosage of the oblique implant is less than that of the N+ implant dosage, and greater than the N− implant by at least a factor of at least 2, a graded junction is created that results in reduced electric field in the channel region. The reduction in electric field strength reduces the hot electron effect. The presence of arsenic in the obliquely-implanted regions also reduces the series resistance of the device. Not only does the graded junction effectively lower the electric field strength in the channel region, but the edge of the spacer, in combination with the implant angle, causes a tapering of the angled implant, which prevents the angle-implanted arsenic dopant from significantly increasing impurity concentration in the N− region of the source/drain regions. Thus, substrate current levels are unaffected. For optimum transistor performance, the N− region must be at least partially overlapped by the gate electrode. The resulting tapered shape of the oblique implant region results in an arsenic gradient which decreases in concentration the closer it is to the edge of the gate electrode. Maximum concentrations of obliquely implanted arsenic will occur along the line adjacent the spacer edge which represents the oblique implant angle. Arsenic implant straggle (scattering) tends to place some of the obliquely-implanted arsenic directly under the spacer. In addition, during activation and reflow steps, some of the implanted arsenic in the maximum concentration region will diffuse toward both the channel region and toward the gate dielectric layer.

FIGS. 6–12 depict the fabrication process for a second embodiment of the improved transistor, intended for use in dynamic random access memory access devices.

Figure 6:
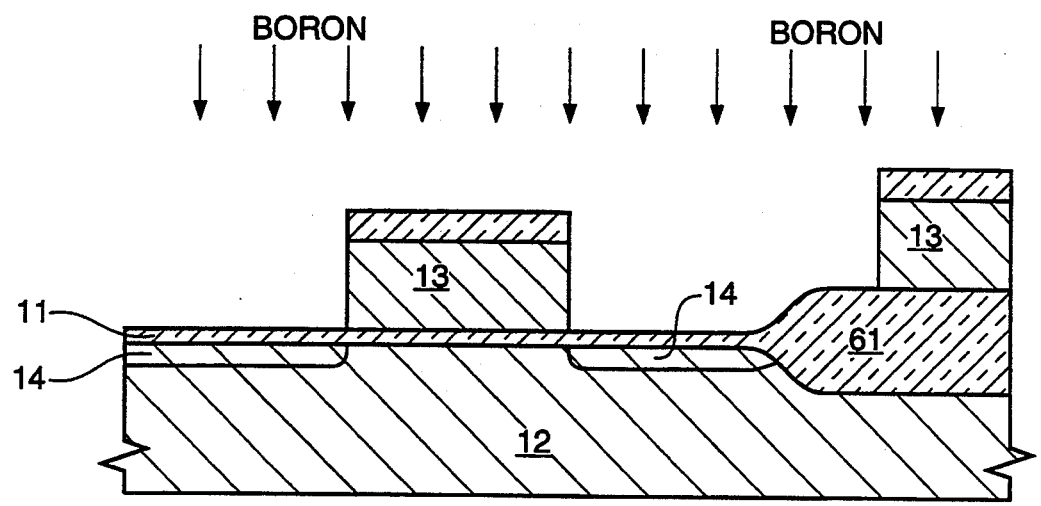
FIG. 6 is a cross-sectional view of a second embodiment of the improved field-effect transistor undergoing fabrication, at the stage where field oxide regions have been grown, a gate dielectric layer has been formed on the substrate, a conductive layer has been patterned to form a gate electrode, and a vertical boron punchthrough implant has been performed.

Referring now to FIG. 6, at this stage of the fabrication process, field oxide regions 61 have been formed on a lightly-doped P-type substrate 12, a gate dielectric layer 11 has been formed on active areas of the substrate 12, a conductive layer (preferably conductively-doped polycrystalline silicon) has been patterned to form a gate electrode 13, and anti-punchthrough regions 14 have been formed with a vertical P-type implant (boron is deemed to be the preferred P-type impurity for this application) that is aligned to the vertical sidewalls of the gate electrode 13. Because it is assumed that the sidewalls of the gate electrode are substantially perpendicular to the underlying substrate 12, one could also say that the boron implant is aligned to the upper edges of the gate electrode.

Figure 7:
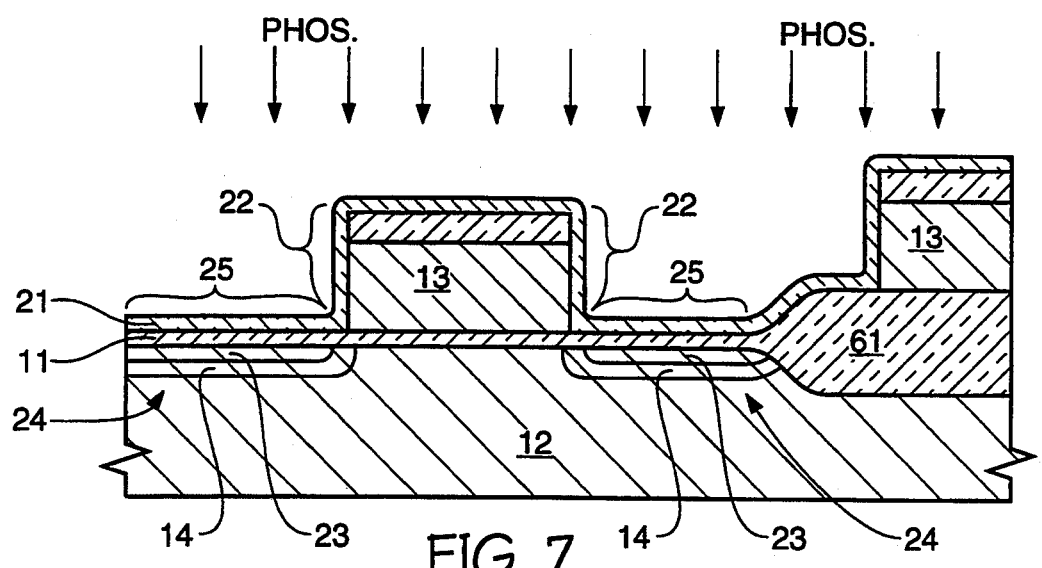
FIG. 7 is a cross-sectional view of the transistor of FIG. 6 following the deposition of a first oxide layer and a vertical N− phosphorus implant.

Referring now to FIG. 7, a first dielectric layer 21 (preferably silicon dioxide) has been conformally deposited over the in-process transistor of FIG. 6. With the first dielectric layer 21 in place, the in-process device is subjected to a vertical N— implant that is aligned to the exposed surfaces of the vertical portions 22 of the first dielectric layer 21 that are deposited on the sidewalls of the gate electrode 13. Phosphorus is the preferred N— impurity, and it is implanted at a dosage within a range of 1-2E13 (1 to $2 \times 10^{13}$ atoms/cm$^2$), and at an energy level within a range of 100–130 Kev. The phosphorus, that forms the N— regions 23 of the source/drain regions 24 in the substrate 12, is implanted through the horizontal portions 25 of the first dielectric layer 21 that directly overly the source/drain regions 25 of substrate 12.

Figure 8:
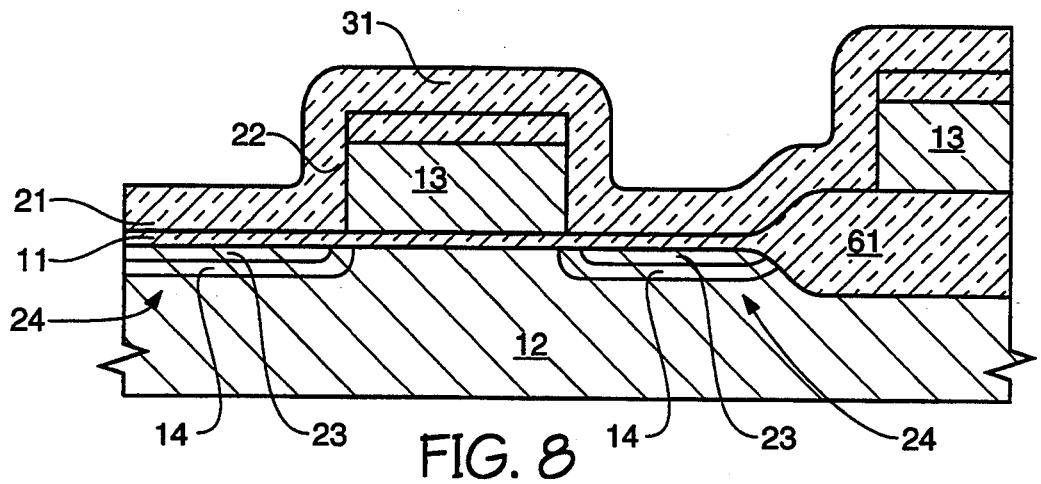
FIG. 8 is a cross-sectional view of the transistor of FIG. 7 following the deposition of a second oxide layer.

Referring now to FIG. 8, a second dielectric layer 31 (preferably silicon dioxide) has been conformally deposited over the in-process transistor of FIG. 7.

Figure 9:
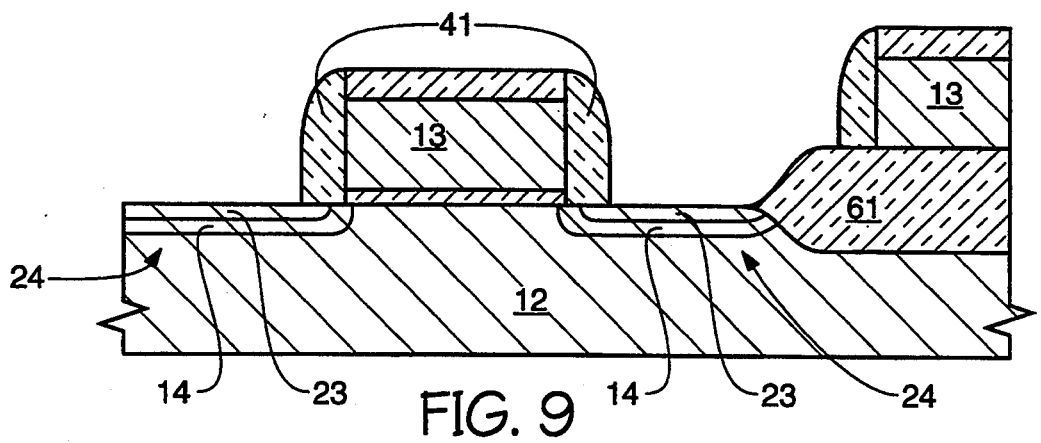
FIG. 9 is a cross-sectional view of the transistor of FIG. 8 following an anisotropic spacer etch.

Referring now to FIG. 9, the in-process transistor of FIG. 8 has been subjected to an anisotropic spacer etch, which has created spacers 41 on the sidewalls of gate electrode 13 and cleared the substrate in the source/drain regions 24. The fabrication of the second embodiment of the improved transistor departs from that of the first embodiment at this state of the process. The vertical N+ implant is performed at a later stage in the manufacturing process, following fabrication of the cell capacitor.

Figure 10:
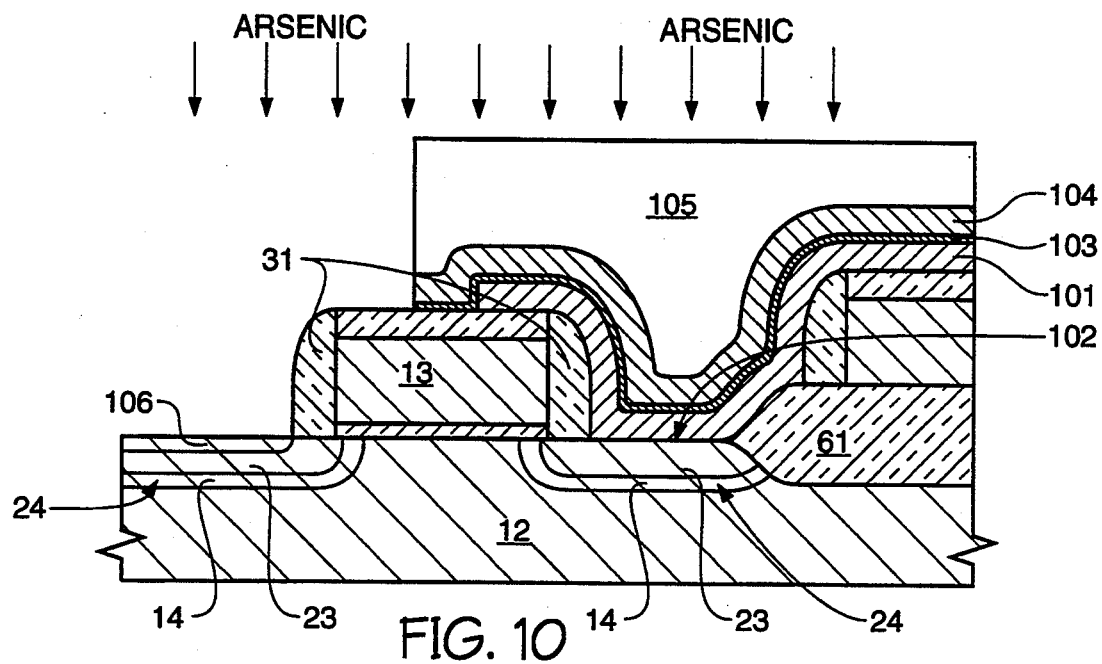
FIG. 10 is a cross-sectional view of the transistor of FIG. 9 following the construction of a cell capacitor and a vertical, N+ arsenic implant.

Referring now to FIG. 10, a cell capacitor has been fabricated such that the bottom plate 101 of the capacitor contacts the storage node 102 of the DRAM cell (when the DRAM cell capacitor is charged, the storage node functions as the source region of the transistor). The cell capacitor also has a cell dielectric layer 103, and an upper capacitor plate 104. With the photoresist mask 105 that was used to pattern the capacitor plate 104 in place, the vertical N+ implant is now performed, thus creating an N+ region 105 in the bitline contact region of the cell. The photoresist mask 105 protects the cell dielectric layer 103 from breakdown during the implant step. The bitline contact region functions as the drain region of the transistor when the cell capacitor is charged). Arsenic is the preferred N+ impurity, and it is implanted at a dosage within a range of 4E15–1.2E16, and at an energy level within a range of 30–60 Kev.

Figure 11:
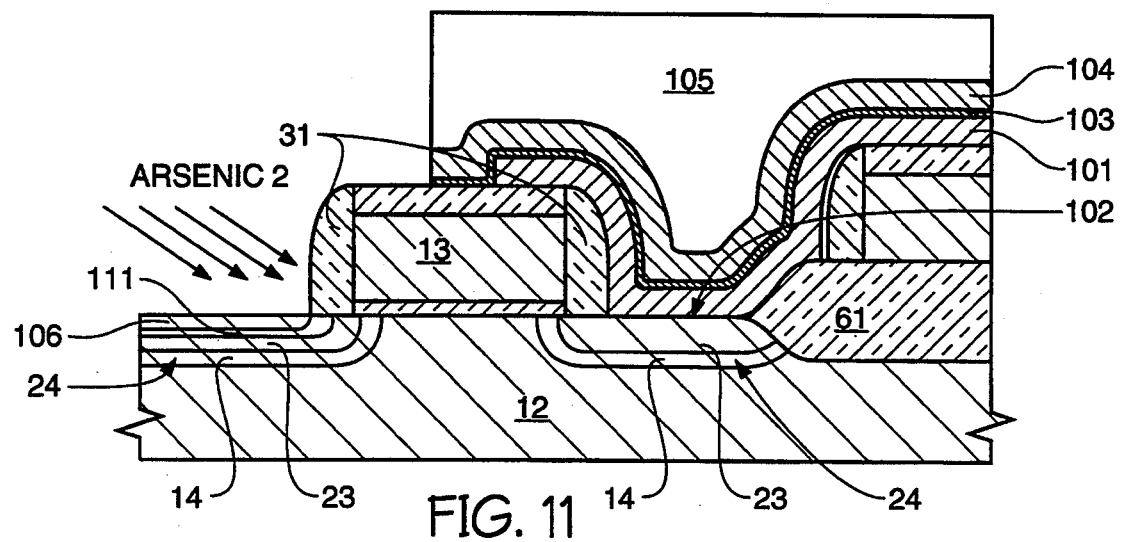
FIG. 11 is a cross-sectional view of the transistor of FIG. 10 following an oblique arsenic implant.

Referring now to FIG. 11, with the photoresist mask 105 still in place, the in-process transistor of FIG. 10 has been subjected to an oblique N-type implant, thus creating an obliquely implanted region 111 in the bitline contact region of the cell (i.e., the drain of the transistor when the capacitor is charged). Arsenic is the preferred impurity for use with the oblique implant, and it is implanted at a dosage within a range of 3E13 to 1E15, at an energy level within a range of 80–120 Key, and at an preferred angle of 40 degrees from the surface of the substrate 12. Although a range of implanting angles between 30 and 50 degrees will provide an acceptable result, impurities implanted at angles much less than 40 degrees may encounter topography, such as elevated field oxide regions, that will effectively block the implant. In addition, too low an implant angle will result in the obliquely implanted arsenic being implanted in the N— region, which will decrease the graded nature of the junction. At angles much above 40 degrees, the effective offset decreases to the point where the oblique implant step becomes increasingly less effective. It will be noted that the cell capacitor has protected the storage node from both the N+ implant and the oblique N-type implant. Comments regarding the oblique implant for the first embodiment of the improved transistor apply to this second embodiment, as well. It should be pointed out that a recognized trend in DRAM fabrication is to eliminate the arsenic implants in the storage node of the DRAM cell. Not only does the presence of arsenic in the storage node junction lower the sub threshold voltage, but arsenic is a large atom, and when it is implanted through a silicon dioxide layer (in this case, first dielectric layer 21), oxygen atoms are likely to be driven from the silicon dioxide layer into the silicon lattice of the substrate 12. This phenomenon, known in the industry as oxygen "knock on", is responsible for current leakage into the substrate. High levels of leakage from the storage node degrade static refresh times.

Figure 12:
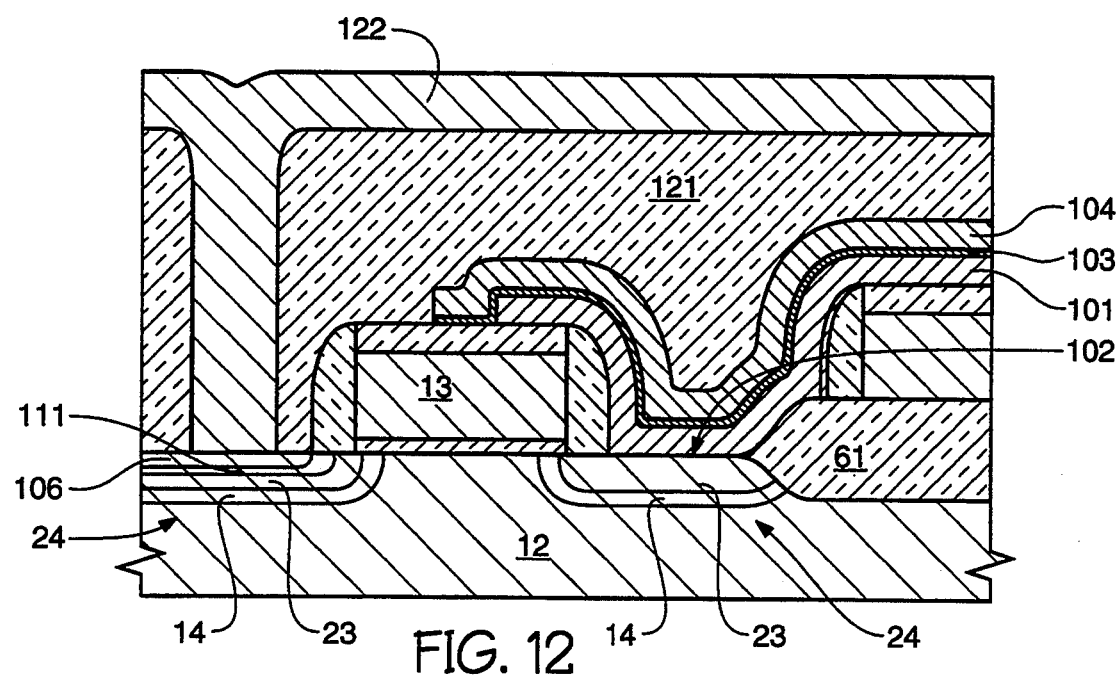
FIG. 12 is a cross-sectional view of the transistor of FIG. 11 following the deposition of a thick dielectric layer and formation of a bitline.

Referring now to FIG. 12, the photoresist mask 105 has been removed, and the in-process DRAM cell of FIG. 11 has been subjected to the deposition of a thick dielectric layer 121, a bitline contact etch, and the formation of a bitline 122.

Although only several embodiments of the invention are described herein, those having ordinary skill in the art will recognize that changes and modifications may be made to the process and to the structure without departing from the invention as hereinafter claimed.

I claim:

1. A process for fabricating an improved N-channel field effect transistor for use as an access device in a dynamic random access memory cell, said transistor having a first source/drain region which functions as a bitline contact region and a second source/drain region which functions as a storage node, said process comprising the following steps:

(a) implanting a P-type impurity aligned to the physical limits of the gate electrode;
    (b) forming a first dielectric layer on at least the exposed vertical surfaces of the gate electrode;
    (c) performing a first implanting of an N-type impurity that is aligned to the exposed surfaces of portions of the dielectric layer covering the exposed vertical surfaces of the gate electrode;
    (d) conformally depositing a second dielectric layer;
    (e) anisotropically etching said first and second dielectric layers to form spacers on the vertical surfaces of the gate electrode;

(f) constructing a cell capacitor superjacent the storage node source/drain region;

(g) performing a second implanting of an N-type impurity that is aligned to the physical limits of the spacer in the bitline contact source/drain region, the cell capacitor preventing implanting of the N-type impurity in the storage node source/drain region during the second implanting; and (h) performing a third implanting of an N-type impurity, said third implanting being performed obliquely, the cell capacitor preventing implanting of the N-type impurity in the storage node source/drain region during the third implanting.

2. The process of claim 1, wherein the first implanting utilizes phosphorus as the impurity.

3. The process of claim 1, wherein said second and third implantings utilize arsenic as the impurity.

4. The process of claim 1, wherein steps (a) through (g) are performed in sequence, with step (a) being the first step.

5. The process of claim 1, wherein steps (a) through (f) are performed in sequence, with step (a) being the first step, and step (h) follows step (f), and step (g) follows step (h).

6. The process of claim 2, wherein the phosphorus is implanted at a dosage within a range of 1 to $2 \times 10^{13}$ atoms/cm$^2$, and at an energy level within a range of 100 to 130 Kev.

7. The process of claim 3, wherein the arsenic used in said second implanting is implanted at a dosage within a range of $4 \times 10^{15}$ to $1.2 \times 10^{16}$ atoms/cm$^2$, and at an energy level within a range of 30 to 60 Kev.

8. The process of claim 3, wherein the arsenic used in said third implanting is implanted at a dosage within a range of $3 \times 10^{13}$ to $1 \times 10^{15}$ atoms/cm$^2$, and at an energy level within a range of 80 to 120 Kev.

9. The process of claim 1, wherein the third implanting is performed at an angle within a range of 30 to 50 degrees from the horizontal.

10. The process of claim 1, wherein the preferred angle for the third implanting is about 40 degrees from the horizontal.

* * * * *

UNITED STATES PATENT AND TRADEMARK OFFICE
CERTIFICATE OF CORRECTION

PATENT NO. : 5,376,566
DATED : Dec. 27, 1994
INVENTOR(S) : Fernando Gonzalez

It is certified that error appears in the above-identified patent and that said Letters Patent is hereby corrected as shown below:

The inventor's state of residence, "Iowa" should be --Id.-- and in item [73], "Iowa" should be --Id.--.

Signed and Sealed this

Twenty-ninth Day of September, 1998

Attest:

BRUCE LEHMAN

*Attesting Officer*     *Commissioner of Patents and Trademarks*